(12) United States Patent
Bickford et al.

(10) Patent No.: US 8,490,040 B2
(45) Date of Patent: Jul. 16, 2013

(54) DISPOSITION OF INTEGRATED CIRCUITS USING PERFORMANCE SORT RING OSCILLATOR AND PERFORMANCE PATH TESTING

(75) Inventors: Jeanne P. Bickford, Essex Junction, VT (US); Peter A. Habitz, Hinesburg, VT (US); Vikram Iyengar, Pittsburgh, PA (US); David E. Lackey, Jericho, VT (US); Jinjun Xiong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/294,220

(22) Filed: Nov. 11, 2011

(65) Prior Publication Data

US 2013/0125076 A1 May 16, 2013

(51) Int. Cl.
*G06F 9/455* (2006.01)
*G06F 17/50* (2006.01)

(52) U.S. Cl.
USPC ............ 716/113; 716/111; 716/108; 716/134

(58) Field of Classification Search
USPC .................................. 716/108, 111, 113, 134
See application file for complete search history.

(56) References Cited

U.S. PATENT DOCUMENTS

| | | | |
|---|---|---|---|
| 5,442,282 A * | 8/1995 | Rostoker et al. | 324/756.04 |
| 6,327,686 B1 | 12/2001 | Grundmann | |
| 6,512,392 B2 * | 1/2003 | Fleury et al. | 324/762.03 |
| 7,327,185 B2 | 2/2008 | Mair et al. | |
| 7,475,366 B2 | 1/2009 | Kuemerle et al. | |
| 7,640,143 B2 | 12/2009 | Bittner et al. | |
| 7,647,573 B2 | 1/2010 | Abadir et al. | |
| 7,856,607 B2 | 12/2010 | Grise et al. | |
| 7,886,247 B2 | 2/2011 | Fatemi et al. | |
| 2004/0002844 A1 | 1/2004 | Jess et al. | |
| 2004/0025123 A1 | 2/2004 | Angilivelil | |
| 2005/0182587 A1 * | 8/2005 | Sato et al. | 702/117 |
| 2007/0255516 A1 | 11/2007 | Patel et al. | |
| 2008/0263489 A1 | 10/2008 | Canada et al. | |
| 2009/0037788 A1 * | 2/2009 | Comai et al. | 714/744 |
| 2009/0193373 A1 | 7/2009 | Abbaspour et al. | |
| 2009/0327986 A1 * | 12/2009 | Goswami et al. | 716/6 |
| 2011/0121838 A1 * | 5/2011 | Gillis et al. | 324/537 |

OTHER PUBLICATIONS

Iyengar et al., Variation-Aware Performance Verification Using At-Speed Structural Test and Statistical Timing, I-4244-1382-06/07 copyright 2007 IEEE, pp. 405-412.

Xiong et al., Optimal Margin Computation for At-Speed Test, 978-3-9810801-3-1/DATE08 copyright 2008 EDAA, 6 pages.

(Continued)

*Primary Examiner* — Vuthe Siek
*Assistant Examiner* — Brian Ngo
(74) *Attorney, Agent, or Firm* — Schmeiser, Olsen & Watts, LLP; Richard Kotulak

(57) ABSTRACT

A method and system for dispositioning integrated circuit chips. The method includes performing a performance path test on an integrated circuit chip having one or more clock domains, the performance path test based on applying test patterns to selected sensitizable data paths of the integrated circuit chip at different clock frequencies; and dispositioning the integrated circuit chip based on results of the performance path test.

29 Claims, 14 Drawing Sheets

OTHER PUBLICATIONS

Xiong et al., Statistical Multilayer Process Space Coverage for At-Speed Test, DAC'09, Jul. 26-31, 2009, San Francisco, CA, USA copyright 2009 ACM 978-1-60558-497-3/09/07, 6 pages.

Xiong et al., Pre-ATPG Path Selection for Near Optimal Post-ATPG Process Space Coverage, ICCAD'09, Nov. 2-5, 2009, San Jose, CA, USA, copyright 2009, ACM 978-1-60558-800-1/09/11, pp. 89-96.

Zolotov et al., Statistical Path Selection for At-Speed Test, 978-1-4244-2820-5/08 copyright 2008 IEEE, pp. 624-631.

Ben et al., Estimating the Probability Density Function of Critical Path Delay via Partial Least Squares Dimension Reduction, 978-1-61284-914-0/11 copyright 2011 IEEE, 7 pages.

Bastani et al., Feature-Ranking Methodology to Diagnose Design-Silicon Timing Mismatch, 0740-7475/10 copyright 2010, IEEE Design & Test of Computers, pp. 42-52.

Singh et al., Binning for IC Quality: Experimental Studies on the SEMATECH Data, 7 pages.

Boskin et al., IC Performance Prediction from Electrical Test Measurements, 0-7803-0680 copyright 1992 IEEE/SEMI Int'l Semiconductor Manufacturing Science Symposium, pp. 13-17.

Cory et al., Speed Binning with Path Delay Test in 150-nm Technology, 0740-7475/03/ copyright 2003 IEEE Design & Test of Computers, Sep.-Oct. 2003, pp. 41-45.

\* cited by examiner

DISPOSITION OF INTEGRATED CIRCUITS USING PERFORMANCE SORT RING OSCILLATOR AND PERFORMANCE PATH TESTING

FIELD OF THE INVENTION

The present invention relates to the field of integrated circuits; more specifically, it relates to methods of performance testing and dispositioning integrated circuits.

BACKGROUND

A current method of dispositioning integrated circuits according to performance relies on a functional test of the logic circuits of the integrated circuits. This method consumes large amounts of time and computer/tester resource to generate the test code and to perform the actual test itself. Another current method of testing the performance of integrated circuits relies on performing a performance screen on ring oscillators formed in various physical locations on the integrated circuit chip. The problem with this technique is false rejects and false accepts because ring oscillator performance does not measure metal line variation. Accordingly, there exists a need in the art to mitigate the deficiencies and limitations described hereinabove.

SUMMARY

A first aspect of the present invention is a method, comprising: performing a performance path test on an integrated circuit chip having one or more clock domains, the performance path test based on applying test patterns to selected sensitizable data paths of the integrated circuit chip at different clock frequencies; and dispositioning the integrated circuit chip based on results of the performance path test.

A second aspect of the present invention is a test system including a tester connected to a computer system comprising a processor, a memory coupled to the processor, and a computer readable storage device coupled to the processor, the storage device containing program code configured to be executed by the processor via the memory to implement a method for dispositioning integrated circuit chips, the method comprising: performing a performance path test on an integrated circuit chip having one or more clock domains, the performance path test based on applying test patterns to selected sensitizable data paths of the integrated circuit chip at different clock frequencies; and dispositioning the integrated circuit chip based on results of the performance path test.

A third aspect of the present invention is a computer program product for dispositioning integrated circuit chips, the computer program product comprising: a computer readable storage device having computer readable program code embodied therewith, the computer readable program code comprising: computer readable program code configured to perform a performance path test on an integrated circuit chip having one or more clock domains, the performance path test based on applying test patterns to selected sensitizable data paths of the integrated circuit chip at different clock frequencies and configured to disposition the integrated circuit chip based on results of the performance path test.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The embodiments of the present invention provide methods of testing and dispositioning integrated circuit chips using a combination of performance sort ring oscillator (PSRO) testing and screening (i.e., PSRO dispositioning) and performance path testing and screening (e.g., dispositioning).

In one example, the PSRO dispositioning is performed at wafer level (on un-singulated chips) and performance path testing dispositioning is performed at module level. The PSRO testing is performed at wider specification limits to reduce false rejects and the performance path testing provides test coverage for all physical regions of the integrated circuit chip having clocked logic circuits which, among other benefits, reduces false accepts. The PSRO testing is a device frequency test.

The term critical path is defined as a data path between an input point and an output point where the time delay of the data signal being presented at the input point and received at the output point must be between upper and lower performance specifications or the integrated circuit will be rejected. Not all data paths are critical paths. In one example, the input and output points of data paths are latches. In one example, the input and output points of data paths are latches of Level Sensitive Scan Design (LSSD) scan chains.

Figure 1:
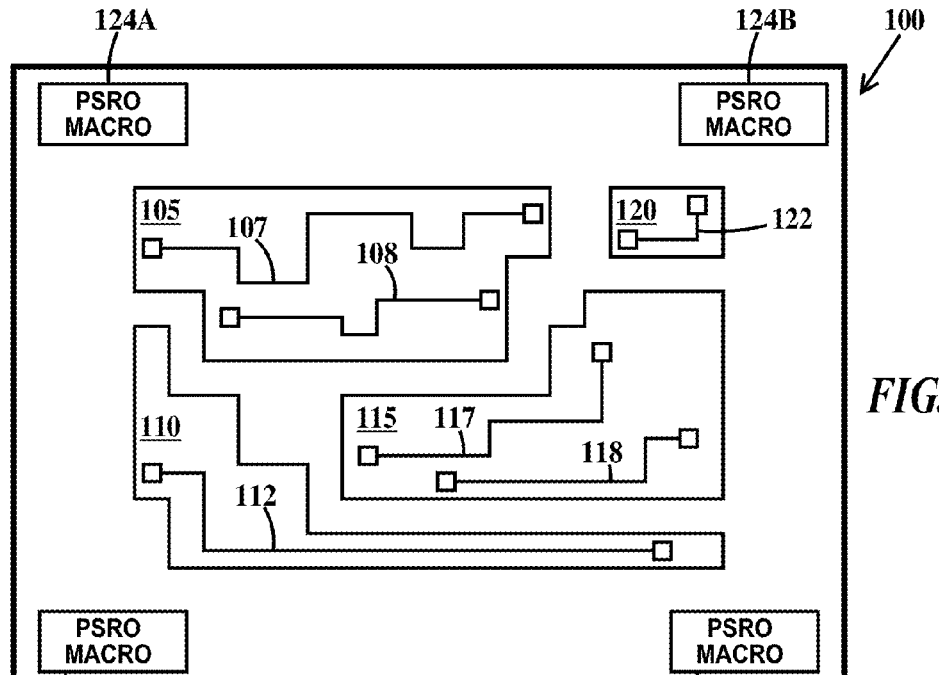
FIG. 1 illustrates clock domains, data paths and performance test structures of an exemplary integrated circuit chip.

FIG. 1 illustrates clock domains, data paths and performance test structures of an exemplary integrated circuit chip. In FIG. 1, an integrated circuit chip 100 includes a clock domain 105 having critical paths 107 and 108, a clock domain 110 having a critical path 112, a clock domain 115 having critical paths 117 and 118 and a clock domain 120 having a critical path 122. A clock domain is logical region of an integrated circuit chip where the elements (e.g., latches, logic gates, etc.) of all critical paths are clocked with the same clock signal. The clock signals of different clock domains may differ from each other in, for example, having different periods, different frequencies, being independently powered (some clock domains may be turned off while others remain powered) and are not necessarily synchronous to each other. While four clock domains are illustrated in FIG. 1, there may be more or less than four clock domains. The number of critical paths within any given clock domain may be more than tens of thousands.

Also illustrated in FIG. 1 are four performance sort ring oscillator (PSRO) macros 124A, 124B, 124C and 124D. A macro is a predesigned circuit that may be added to an integrated circuit design in one or more locations. In the present example, PSRO macros 124A, 124B, 124C and 124D are added proximate to the corners of the integrated circuit. The contents of PSRO macros 124A, 124B, 124C and 124D are illustrated in FIG. 11B and described infra.

Figure 2:
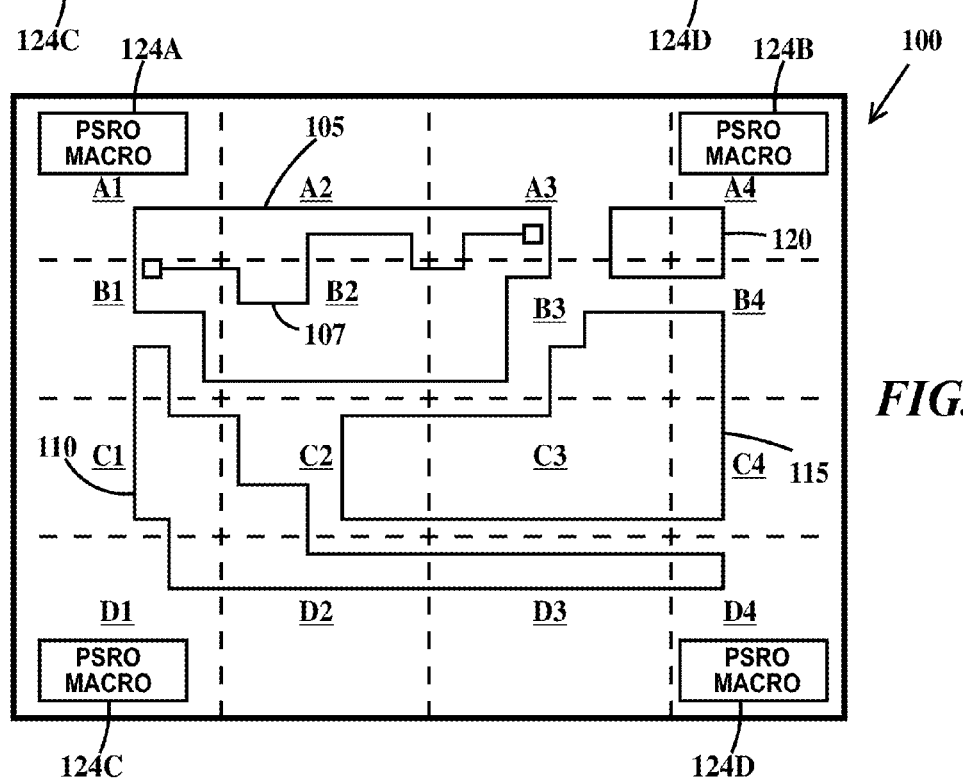
FIG. 2 illustrates the exemplary integrated circuit chip of FIG. 1 partitioned into regions used to generate performance paths used by embodiments of the present invention.

FIG. 2 illustrates the exemplary integrated circuit chip of FIG. 1 partitioned into regions used to generate performance paths used by embodiments of the present invention. In FIG. 2, integrated circuit 100 has been partitioned into sixteen contiguous regions A1, A2, A3, A4, B1, B2, B3, B4, C1, C2, C3, C4, D1, D2, D3, and D4. Some regions include portions of only one clock domain (e.g., clock region A1 includes only a portion of clock region 105) and some clock regions may include portions of multiple clock regions (e.g., region B1 includes a portion of clock domain 105 and 110). Some regions may include no clock domains. While critical paths 108, 112, 117, 118 and 122 of FIG. 1 are not illustrated in FIG. 2 for clarity, critical path 107 has been illustrated to show that any given critical paths may cross region boundaries. For example, critical path 107 starts in region B1, passes through region B2, then through A2, back again into region B2, then through region B3 and ends in region A3.

Figure 3:
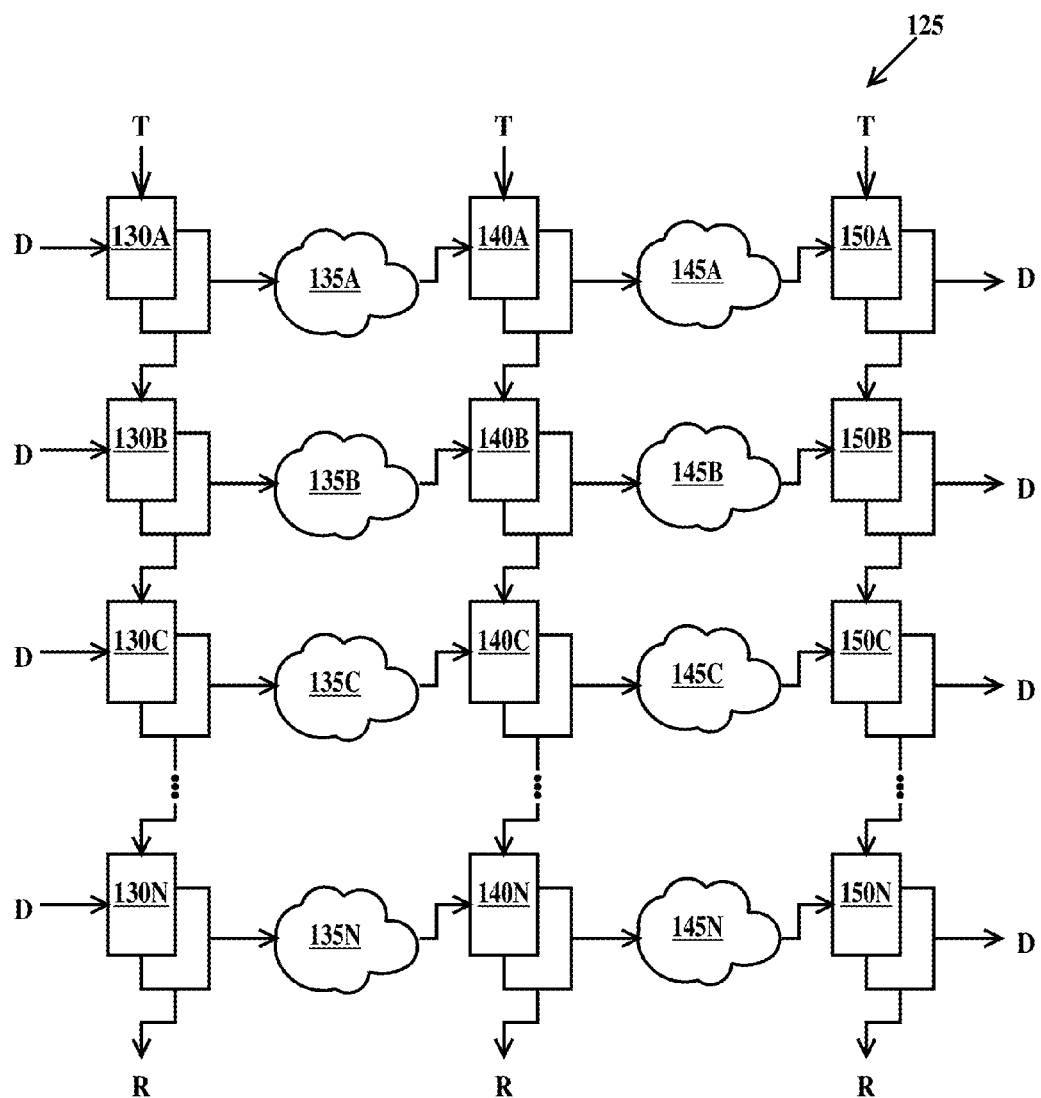
FIG. 3 is an exemplary schematic diagram of a scan latch circuit used in testing logic circuits of integrated circuits.

FIG. 3 is an exemplary schematic diagram of a scan latch circuit used in testing logic circuits of integrated circuits. In FIG. 3, and LSSD scan chain 125 includes a first set of latches 130A through 130N, a second set of latches 140A through 140N and a third set of latches 150A through 150N. Each latch has a first input for operational data, a second input for test data, a first output for operational data and a second output for resultant test data. Data is clocked through logic gates in clouds of logic 135A through 135N from respective latches 130A through 130N to respective latches 140A through 140N by a data clock, usually designated the "A" clock. Data is clocked through logic gates in clouds of logic 145A through 145N from respective latches 140A through 140N to respective latches 150A through 150N by the same data clock. Test data is clocked through latches 130A through 130N, latches 140A through 140N and through latches 150A through 150N, by a first test clock, usually designated clock "C." Test data is clocked through logic circuits 135A to 145A through logic circuits 135N to 145N by a second test clock, usually designated clock "B." Clock "A" is the domain clock. A critical path starts and stops with a scan latch and includes a data path within the logic gates of the logic cloud connected by the two scan latch, for example latch 130A, logic cloud 135A and latch 140A.

Figure 4:
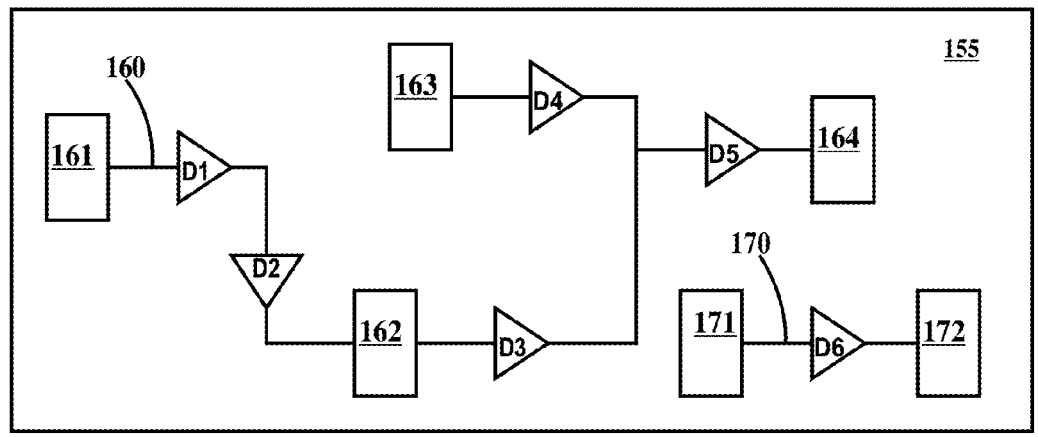
FIG. 4 is a schematic diagram illustrating two critical paths belonging to different clock domains in a same region of an integrated circuit chip.

FIG. 4 is a schematic diagram illustrating two critical paths belonging to different clock domains in a same region of an integrated circuit chip. In region 155, a logic circuit 160 of a first clock domain comprises latches 161, 162, 163 and 164 and delays D1, D2, D3, D4 and D5. The delays represent the timing delay through combination logic (sequences of logic gates). There are three possible critical paths for logic circuit 160. The first is latch 163, delay D4, delay D5, and latch 164. The second is latch 162, delay D3, delay D5, and latch 164. Region 155 also includes a logic circuit 170 of a second clock domain and comprising latches 171 and 172 and delay D6. Logic circuit 160 presents a problem in that it is desirable to select the most critical path out of the three possible critical paths (assuming only one critical path is selected for the clock domain). This is resolved by an algorithm called "branch-and-bound." See U.S. Pat. No. 7,886,247 issued Feb. 8, 2011 which is hereby incorporated by reference.

Figure 5:
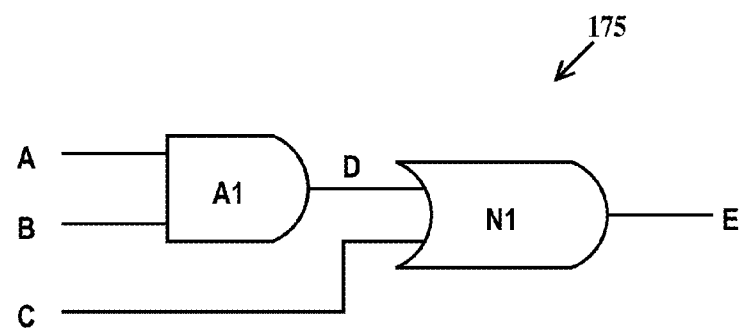
FIG. 5 is an exemplary schematic diagram of a simple logic circuit illustrating the principle of path sensitization.

FIG. 5 is an exemplary schematic diagram of a simple logic circuit illustrating the principle of path sensitization. In FIG. 5, a logic circuit comprises an AND gate A1 having a first input A and a second input B, and output D which is also a first input of a NAND gate N1, having a second input C and an output E. To robustly test the path A to E, C must be kept a zero if a fault on A is to be detected independent of the value on B. The test pattern generated for testing the path A to E must include placing a zero on C while A transitions from zero to one and from one to zero. The same is true for robustly testing the path B to E. Application of path sensitization ensures that only robust tests are created for a given critical path, with no glitches, false fails or false accepts (test escapes).

Figure 6:
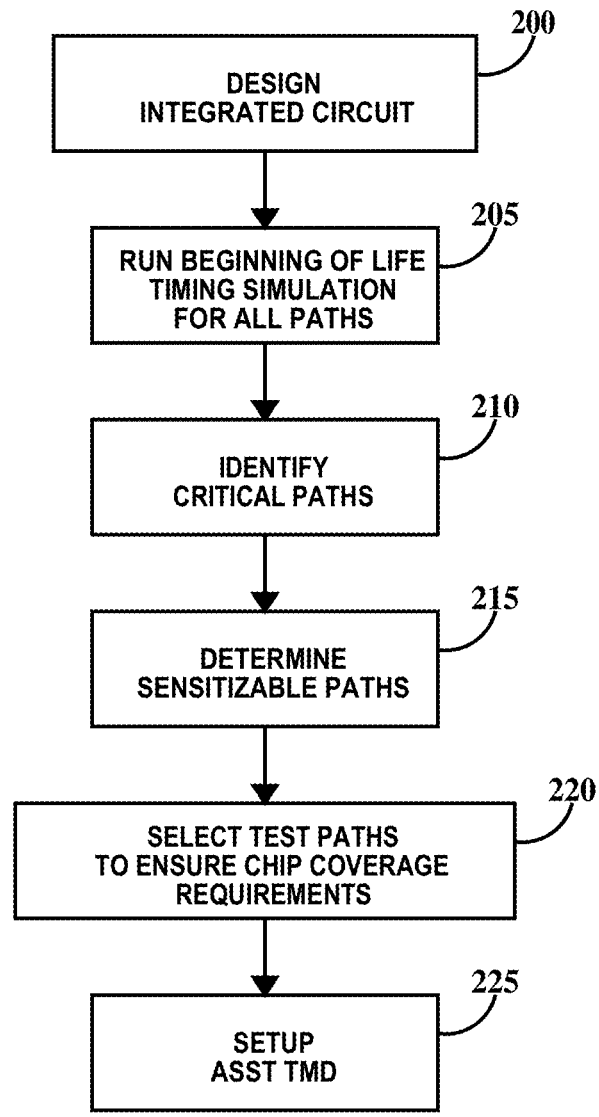
FIG. 6 is a flow diagram of the concept of generating a performance path test used by embodiments of present invention.

FIG. 6 is a flow diagram of the concept of generating a performance path test used by embodiments of present invention. In step 200, an integrated circuit is designed. In step 205, a beginning of life static statistical timing analysis for the integrated circuit chip is performed where all timing information is represented as a canonical form, i.e., the timing Di is represented as a function of nominal process delay DNi and process parameter induced delay SPi as $Di=DNi+\Sigma^P(SPi)$. In step 210, the critical paths are identified by the "branch and bound" algorithm discussed supra. In step 215, the sensitizable paths are identified. The sensitizable paths are the subset of critical paths that are testable. Sensitizable paths are generated, for example, using an Automatic Test Pattern Generator (ATPG) check program. In step 220, a subset of the sensitizable paths (i.e., test paths) is selected to ensure adequate integrated circuit chip test coverage. The test paths should provide test coverage for delay limits (e.g., $2\sigma$, $3\sigma$, etc.) for the following process parameters: across chip variations (e.g., high and low density of polysilicon lines, high and low density of substrate isolation, density of wiring, etc.) and wiring levels (e.g., which wiring levels are used and the length of wire on each level). A general methodology for selecting the subset of sensitizable parts is described infra with respect to FIGS. 7 and 8. More specific embodiments are described infra with respect to FIGS. 9 and 10. In step 225, a test program is generated, for example, a performance path testing At Speed Structural Test (ASST) including Test Manufacturing Data (TMD) is generated. The TMD contains the information required to setup a tester to perform performance path testing ASST testing according to embodiments of the present invention.

Figure 7:
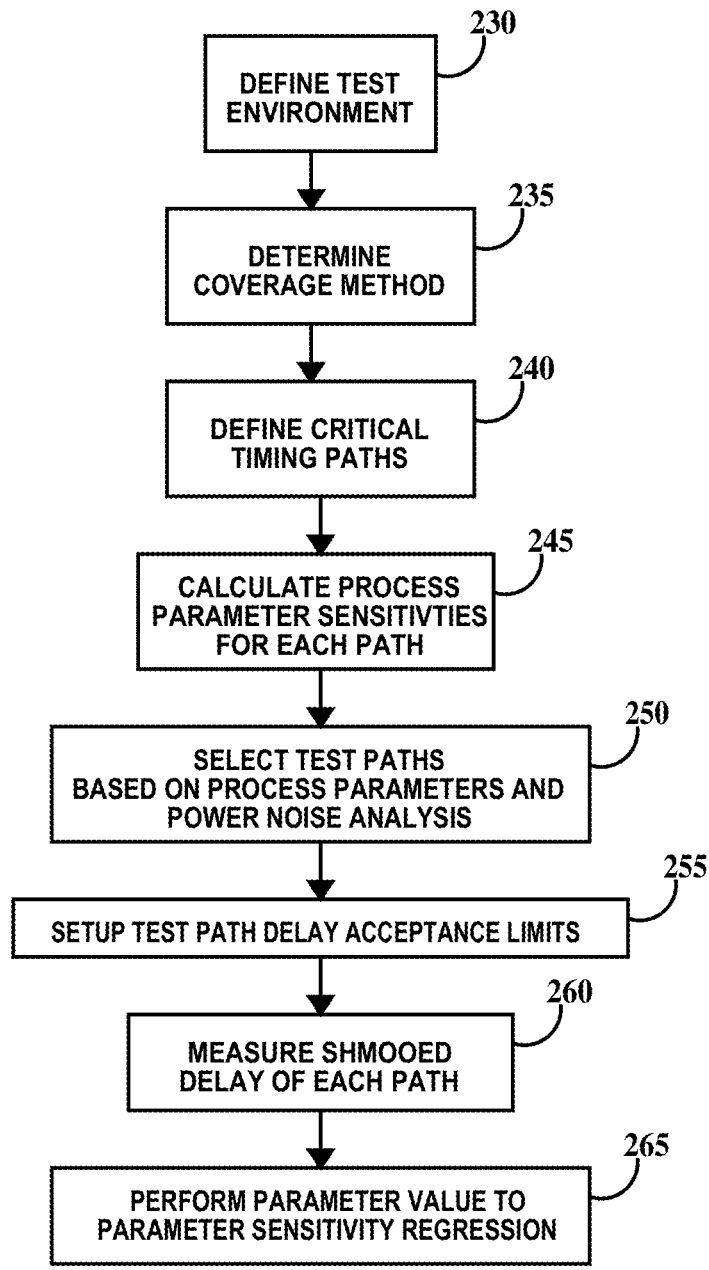
FIG. 7 is a flow diagram of a general method of generating a performance path test used by embodiments of present invention.

FIG. 7 is a flow diagram of a general method of generating a performance path test used by embodiments of present invention. In step 230, the test environment is defined. This includes running an across-chip AC power noise simulation which includes power-up-power-down cycling to select a power level range having minimum or no signal-to power coupling noise to perform a static timing simulation. Then the static statistical timing is performed with the selected power range, a test temperature, and the beginning of life process parameters. In step 235, the test coverage method for performance path testing (see FIGS. 9 and 10 and discussion infra) is selected. In step 240, critical paths by clock domain are selected. In step 245, for each critical path, timing delay sensitivities to process parameter are calculated. In step 250, a subset of the critical paths (i.e., test paths) is selected. The selection criteria includes: selecting critical paths with a range of different process parameters. In step 255, test path delay limits acceptance limits are setup. These include worst case (WC) (e.g., late data arrival and early clock at the input point of the path) and best case (BC) (e.g., early data arrival and late clock at the input point of the path). In step 260, the frequency shmooed delay of each path of a subset of the critical paths is run on a sample of integrated circuit chips using a tester. The results are evaluated in step 280 of FIG. 8 discussed infra.

Figure 8:
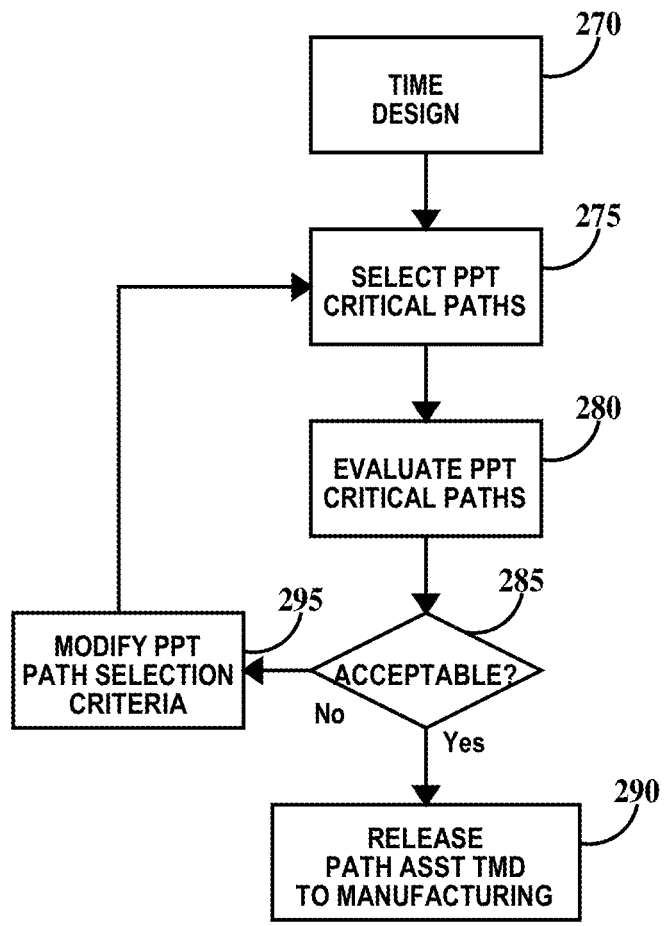
FIG. 8 is a flow diagram of a method of verifying test paths used for performance path testing used by embodiments of present invention.

FIG. 8 is a flow diagram of a method of verifying test paths used for performance path testing used by embodiments of present invention. In step 270, the integrated circuit design is timed as described supra. In step 275, the test paths are selected as described supra. In step 280, the test paths are evaluated by testing a sample of physical integrated circuit chips as illustrated in steps 255, 260 and 265 of FIG. 7 and described supra. In step 285, it is determined (for example, from the regression analysis) if the Path ASST TMD results are acceptable. If the results are acceptable, then in step 290, the Path ASST TMD is released to manufacturing test. If the results are not acceptable, then in step 295, the test paths selection "rules" are modified and the method loops back to step 275.

Figure 9:
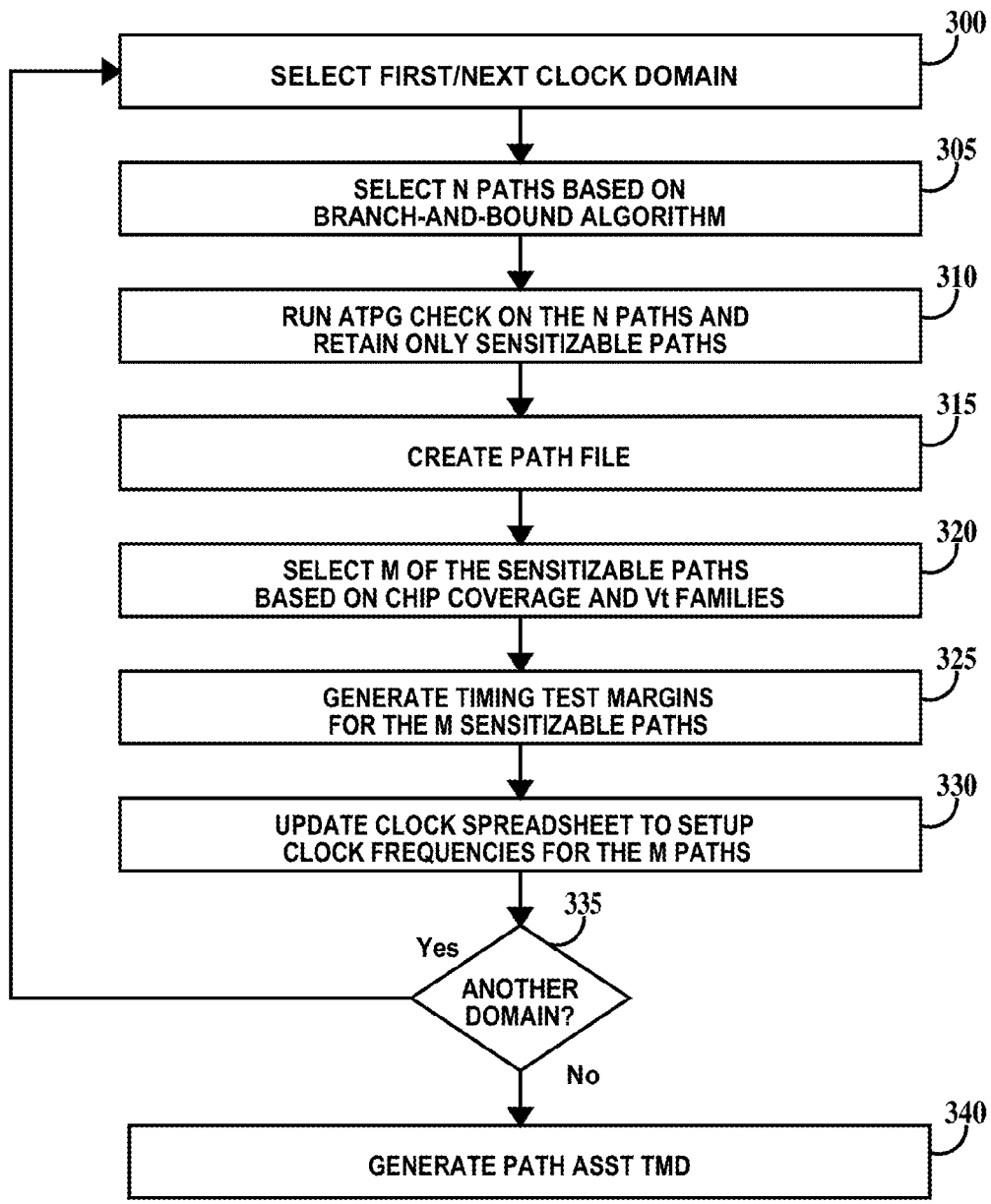
FIG. 9 is a flow diagram of a first method of selecting test paths for performance path testing used by embodiments of present invention.

FIG. 9 is a flow diagram of a first method of selecting test path for performance path testing used by embodiments of present invention. In step 300, the first/next clock domain of the integrated circuit is selected. In step 305, N critical paths are selected based on a branch-and-bound algorithm. N is an integer greater than 1. In one example, N is at least about 1000. In step 310, an ATPG check is run on the N paths and only the sensitizable (e.g., testable) paths are retained. In step 315, a path file is created. The path file includes such information as physical path location, designed path timing delay, designed slack (slack is the difference between required arrival time of data at a latch and the actual time the data arrives), and designed upper and lower timing bounds (e.g., WC and BC) for each path. In step 320, M of the sensitizable paths are selected to include paths from different regions of the chip and to include a variety of paths of high sensitivities to different Vt (threshold voltage) families because the designed delay in a path is a function of the designed Vt of the transistors of the circuit path. M is an integer greater than 1. In one example, step 320 is performed manually. In one example, step 320 is performed automatically and then adjusted manually. In step 325, timing test margins (frequency and/or voltage) for the M sensitizable paths are generated based on path timing information. In step 330, the clock spreadsheet generated during design of the integrated circuit is updated to reflect the test clock frequency to be used for each of the M paths based on the test margins of step 330. In one example, step 330 is performed automatically. In one example, step 330 is performed manually. In one example, step 330 is performed automatically and then adjusted manually. In step 335, it is determined if there is another clock domain to process. If so, the method loops back to step 300, otherwise the method proceeds to step 340. In step 340, a path ASST TMD is generated using, for example, an ATPG tool. Note M and N may vary from clock domain to clock domain.

Figure 10:
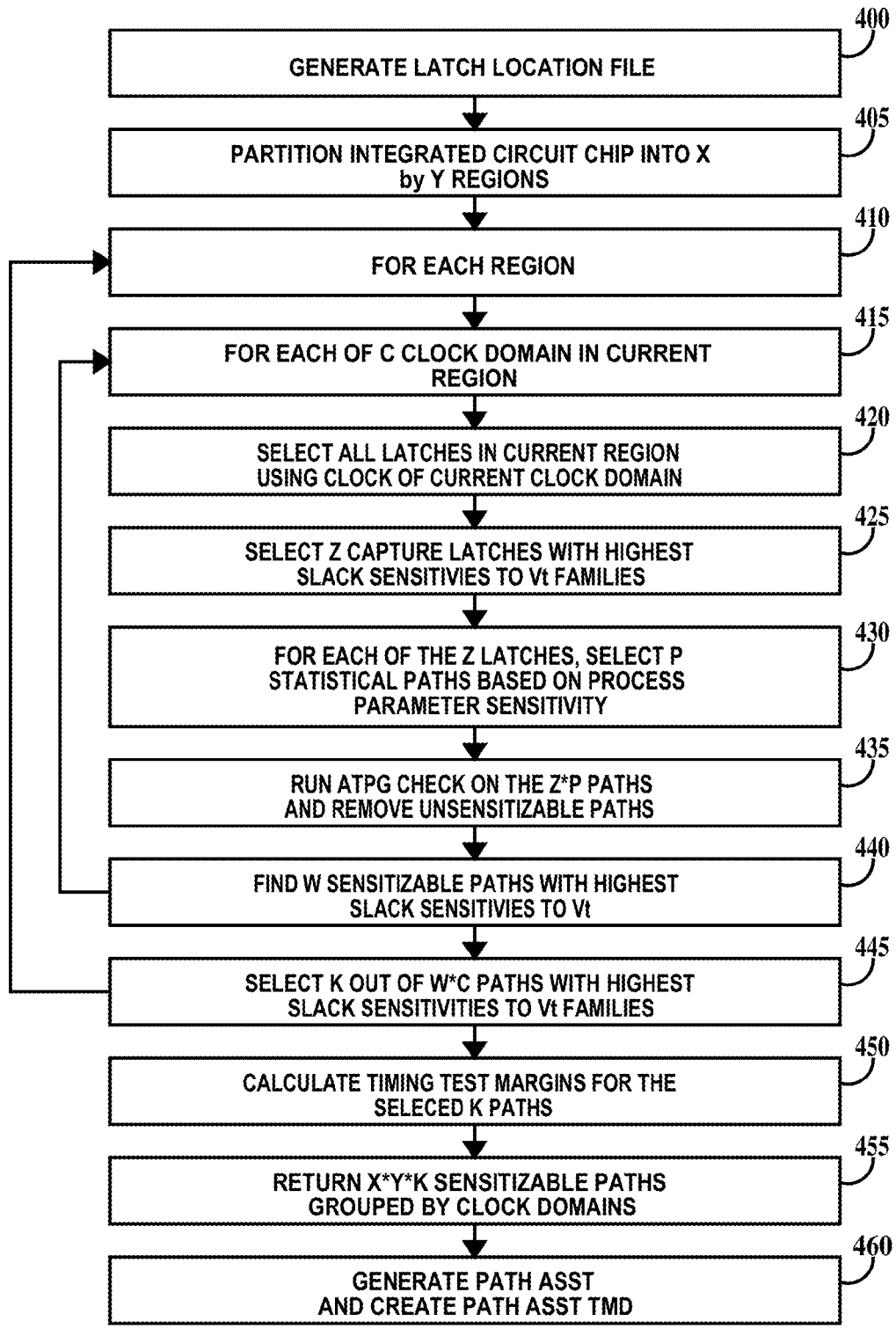
FIG. 10 is a flow diagram of a second method of selecting test paths for performance path testing used by embodiments of present invention.

FIG. 10 is a flow diagram of a second method of selecting test paths for performance path testing used by embodiments of present invention. In step 400, a latch location file is generated. The latch location file includes the location on the integrated circuit of all scan latches (e.g., LSSD latches) in the integrated circuit design. In step 405, the integrated circuit design is partitioned into X by Y (=R) regions. See for example, FIG. 2 where X=Y=4 and integrated circuit 100 has been partitioned into 16 regions. In step 410, a loop of steps by region is started. In step 415, a sub-loop of steps by clock domain is started which is performed for all clock domains in the current region. There are C clock domains in each region, but C may vary from region to region. X is an integer greater than 1. Y is an integer greater than 1. C is an integer greater than 1.

Starting the clock domain sub-loop, in step 420, all latches in the Current region and using the clock of the current clock domain are selected. In step 425, Z latches having the highest slack sensitivities to Vt families are selected. In order to break "ties" slack sensitivities to wiring parameters (e.g., length of wires by wiring level), test margins (e.g., voltage, frequency), may be used. Z is an integer greater than 1. In one example, Z=200. In step 430, for each of the Z latches, P paths are selected based on process parameter sensitivities (e.g., across chip variations, high and low density of polysilicon lines, high and low density of substrate isolation, density of wiring, etc.) and wiring levels (e.g., which wiring levels are used and the length of wire on each level). P is an integer greater than 1. In one example, P=5. In step 435, an ATPG check is run on the Z*P (in the examples, 200*5=1000). In step 435, an ATPG check is run on the Z*P paths to remove unsensitizable paths. In step 440, W sensitizable paths having the highest slack sensitivities to Vt families are selected. In order to break "ties" slack sensitivities to wiring parameters (e.g., length of wires by wiring level), test margins (e.g., voltage, frequency), may be used. In one example, W=2. Steps 420 through 440 are repeated for each clock domain in the current region.

Continuing the region loop, in step 445, K of the W*C sensitizable paths having the highest slack sensitivities to Vt families are selected. In order to break "ties" slack sensitivities to wiring parameters (e.g., length of wires by wiring level), test margins (e.g., voltage, frequency), may be used. In one example, K=2. In step 450, the test timing margins (voltage, frequency) are calculated for the K paths. Steps 410, 445 and 450 are repeated for each region.

In step 455, there will be X*Y*K sensitizable paths grouped by clock domains. In the example of X=4, Y=4 and K=2, there will be 32 paths. In step 460, a path ASST TMD is generated for performance path testing the X*Y*K sensitizable paths using, for example, an ATPG tool. Note M and N may vary from clock domain to clock domain.

Figure 11:
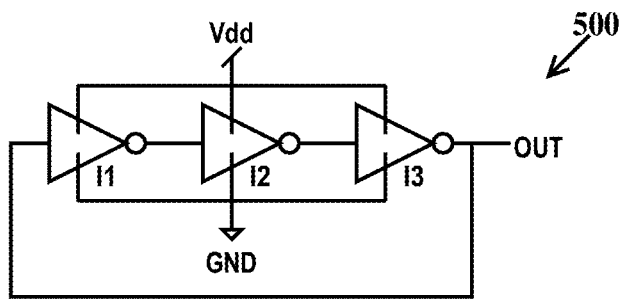
FIG. 11 is a schematic diagram of an exemplary ring oscillator.

FIG. 11 is a schematic diagram of an exemplary ring oscillator. In FIG. 11A, a ring oscillator comprises three inverters I1, I2 and I3 connected in series. The output of inverter I1 connected to the input of inverter I2, the output of inverter I2 connected to the input of inverter I3, the output of inverter I3 connected to the input of inverter I1. The output of inverter I3 is also the output of ring oscillator 500. While three inverters are illustrated, there may be as few as three or more than three but odd number of inverters in ring oscillators used in the PSRO macros of embodiments of the present invention.

Figure 12:
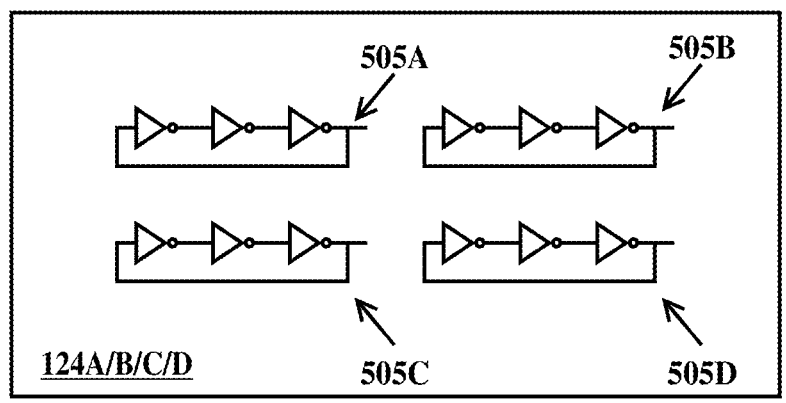
FIG. 12 is a schematic diagram of an exemplary performance sort ring oscillator macro.

FIG. 12 is a schematic diagram of an exemplary performance sort ring oscillator macro. In FIG. 12, each of macros 124A, 124B, 1254C and 124D (see FIG. 1) include four ring oscillators 505A, 505B, 505C and 505D. Each of ring oscillators 505A, 505B, 505C and 505D is fabricated from transistors belonging to a different and only one threshold voltage (Vt) family. For example, the devices of ring oscillator 505A belong to Vt family 1 and are the fastest and have the most leakage, the devices of ring oscillator 505B belong to Vt family 2 and are the second fastest and have the second most leakage, the devices of ring oscillator 505C belong to Vt family 3 and are the third fastest and have the third most leakage and the devices of ring oscillator 505D belong to Vt family 4 and are the slowest and have the least leakage. In one example, the physical difference between the Vt families is the effective Tox (thickness) of the gate dielectric. The smaller Tox, the lower the Vt and the faster and more leaky the device. PSRO macro testing may be used to disposition integrated circuits based on the frequency output of the ring oscillators which may be converted to a PSRO delay value. There may be as few as one ring oscillator in a PSRO macro. While four ring oscillators are illustrated, there may be as few as one or more than four, so "four" should be considered exemplary.

Figure 13A:
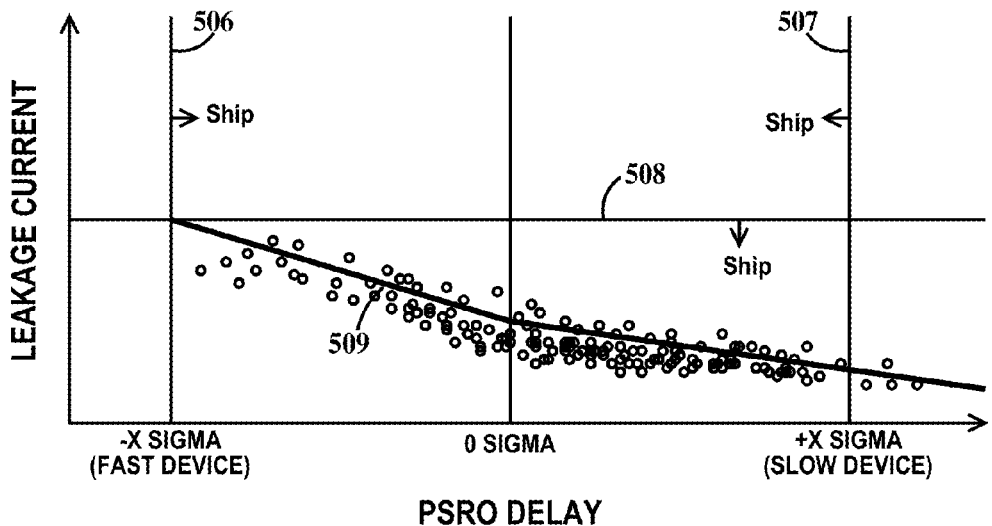
FIG. 13A illustrates dispositioning of product using performance sort ring oscillator testing having an acceptable power to performance ratio.

FIG. 13A illustrates dispositioning of product using performance sort ring oscillator testing having an acceptable power to performance ratio. In FIG. 13A, lines 506 and 507 represent distribution limits (sigma limits as defined by the normal Gaussian distribution) of PSRO delay. Line 506 is negative X sigma and represents the fastest devices (e.g., field effect transistors (FETs)) allowed and line 507 is positive X sigma and represents the slowest devices allowed. Line 508 represents the maximum device leakage current limit (the lower limit is zero). Curve 509 is a curve fit of current leakage versus PSRO delay for a multiplicity of individual chips (each chip is represented by a circle). In FIG. 13A, the negative X sigma and positive X sigma limits fairly represent the actual distribution of the chips.

Figure 13B:
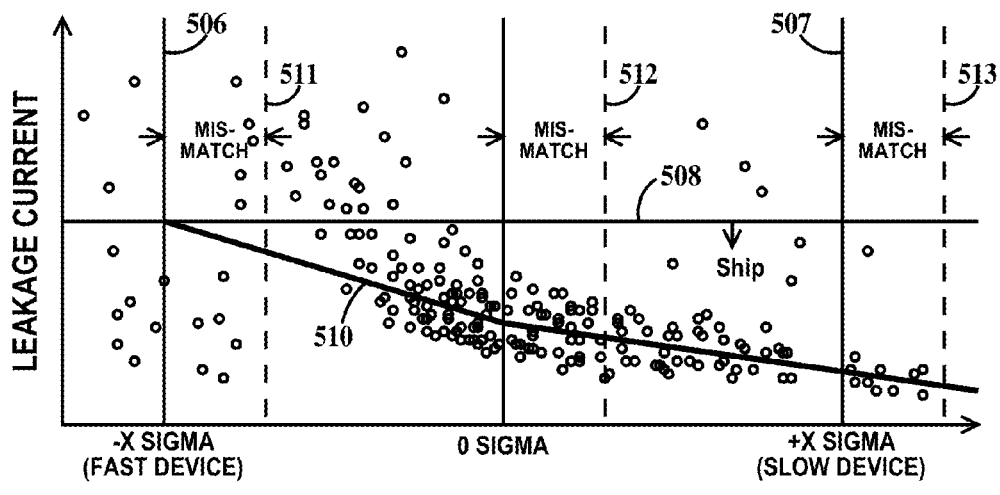
FIG. 13B illustrates dispositioning of product using performance sort ring oscillator testing having an unacceptable power to performance ratio.

FIG. 13B illustrates dispositioning of product using performance sort ring oscillator testing having an unacceptable power to performance ratio. In FIG. 13B, lines 506 and 507 again represent distribution limits (sigma) of PSRO delay. Line 506 is negative X sigma and represents the fastest devices (e.g., field effect transistors (FETs)) allowed and line 507 is positive X sigma and represents the slowest devices allowed. Line 508 again represents the maximum device leakage current limit (the lower limit is zero). Curve 510 is a curve fit of current leakage versus PSRO delay for a multiplicity of individual chips (each chip is represented by a circle). Curve 510 is very similar to curve 509 of FIG. 13A, but the individual chip distribution is much different. In FIG. 13B, the negative X sigma and positive X sigma limits do not fairly represent the actual distribution of the chips. The actual distribution is more fairly represented by lines 511, 512 and 513.

Figure 13C:
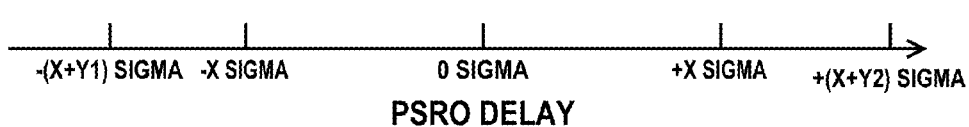
FIG. 13C illustrates performance sort ring oscillator test specifications according to embodiments of the present invention.

FIG. 13C illustrates performance sort ring oscillator test specifications according to embodiments of the present invention. In FIG. 13C, the PSRO delay specification lower limit is set at negative (X+Y1) and the upper limit at positive (X+Y2). In one example, Y1 is equal to Y2. In one example, Y1 is different from Y2. In one example, Y1 is zero (in which case the limit negative X sigma is the same as negative (X+Y1) signal. These expanded limits more fairly represent the combination of chip distributions of both FIGS. 13A and 13B. However, while dispositioning product using the expanded limits would reduce false rejects it could increase false accepts. Therefore is desirable to add a second product dispositioning screen to catch the false accepts.

Figure 14A:
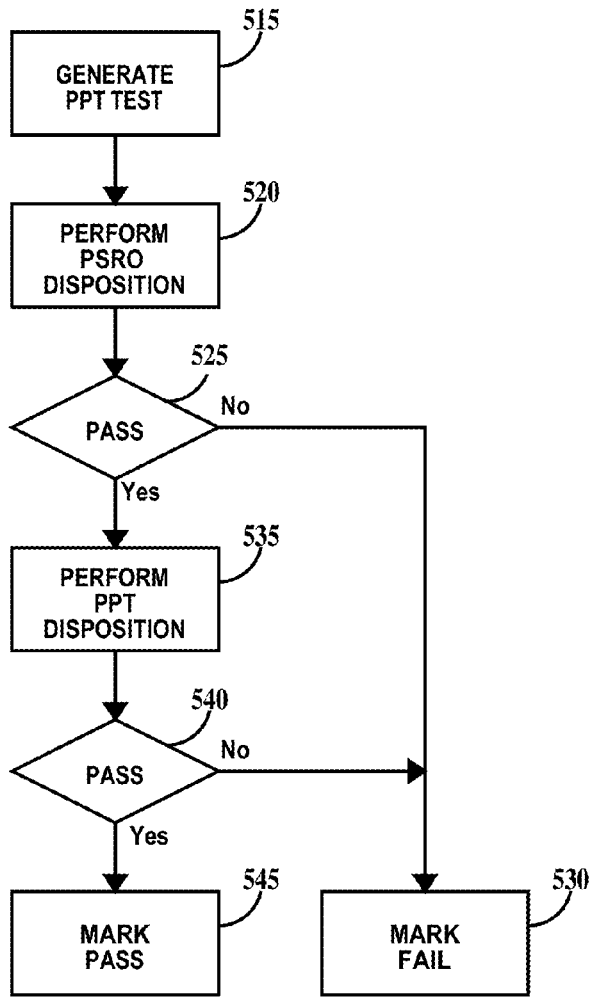
FIG. 14A is a flowchart of a method of dispositioning integrated circuit chips according to embodiments of the present invention.

FIG. 14A is a flowchart of a method of dispositioning integrated circuit chips according to embodiments of the present invention. In step 515, a frequency based performance path testing test is generated using one of the methods described infra. This includes selecting performance path testing paths from every clock domain and generating performance path testing test patterns. In step 520, a PSRO disposition is performed. It is preferred that PSRO disposition be performed at wafer level though it may be performed at module level. Step 520 is illustrated in more detail in FIG. 15 and described infra. In step 525, any chips (or modules) that do not pass the PSRO disposition are marked as fail in step 530 and are not subject to performance path testing dispositioning in step 535. For chips that pass the PSRO disposition, in step 535 a performance path testing disposition is performed. It is preferred that performance path testing disposition be performed at module level though it may be performed at wafer level. Step 535 is illustrated in more detail in FIG. 16 and described infra. In step 540, any modules (or chips) that do not pass the performance path testing disposition are marked as fail in step 530. In step 540, any modules (or chips) that pass the performance path testing disposition are marked as pass in step 545. When step 520 is performed on chips at wafer level and step 535 is performed on chips mounted on modules, there are intervening steps between step 525 and 535 of dicing the wafer, picking the passed chips and mounting the passed chips on modules.

Figure 14B:
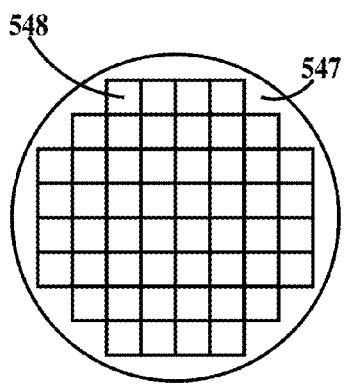
FIG. 14B illustrates in top view un-singulated integrated circuit chips on a wafer.

FIG. 14B illustrates in top view un-singulated integrated circuit chips on a wafer. In FIG. 14B, a semiconductor wafer 547 includes multiple integrated circuit chips 548 formed on the wafer. Testing while integrated circuit chips are un-singulated is wafer level testing. During singulation (i.e., dicing) the wafer is cut horizontally and vertically between the columns and rows of chips and the individual chips collected.

Figure 14C:
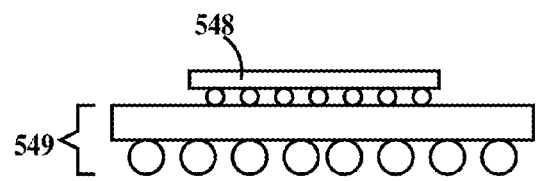
FIG. 14C illustrates in side view an integrated circuit chip mounted on a module.

FIG. 14C illustrates in side view an integrated circuit chip mounted on a module. In FIG. 14C, by way of example, an integrated circuit 548 has been flip-chip mounted on a ball grid array module 549. Testing an integrated circuit chip after mounting on a module is module level testing.

Figure 15:
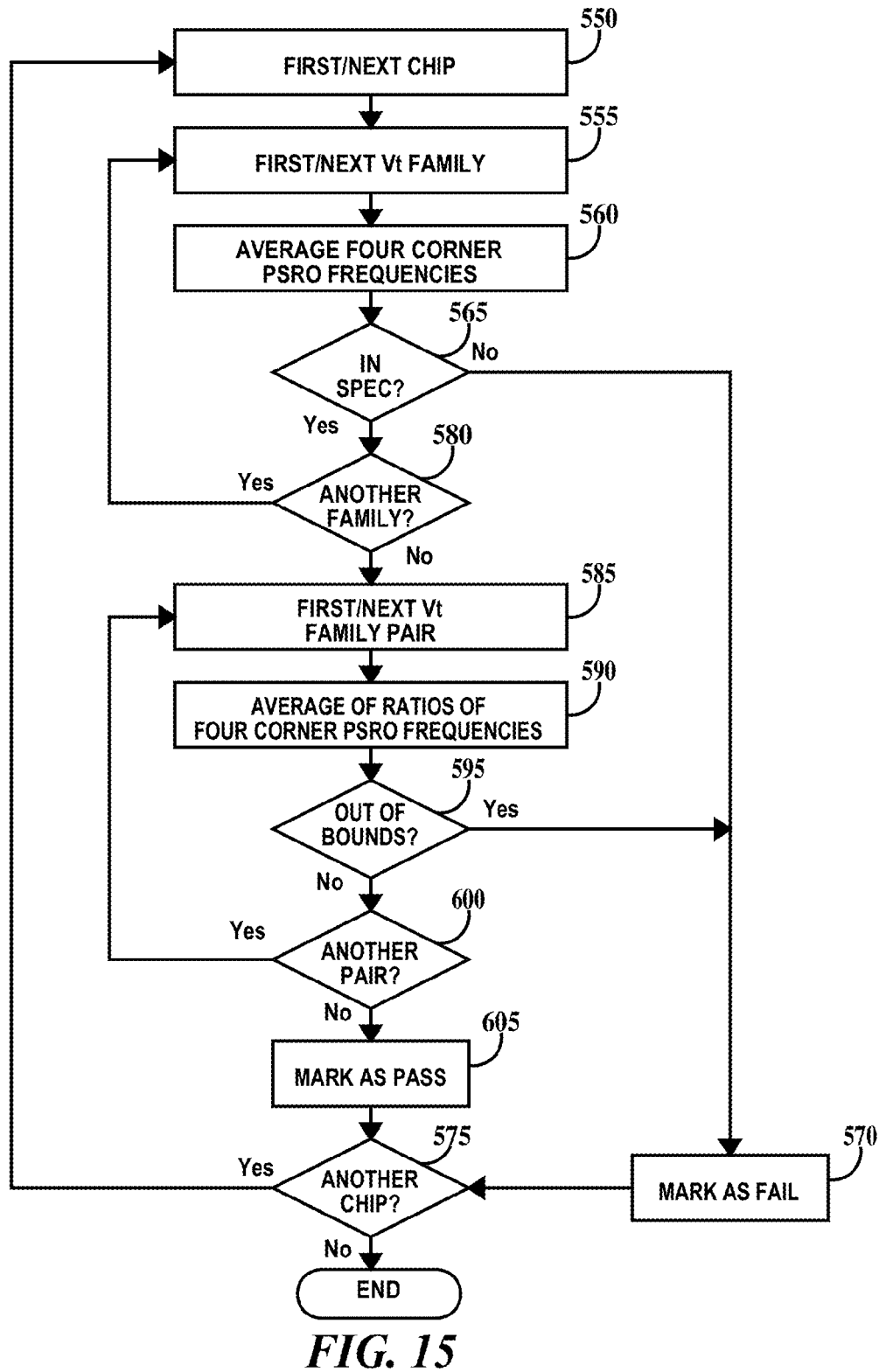
FIG. 15 is a flowchart of a method of performance sort ring oscillator testing according to embodiments of the present invention.

FIG. 15 is a flowchart of a method of performance sort ring oscillator testing according to embodiments of the present invention. In step 550, the first/next chip is selected. In step 555, the first/next Vt family is selected. When there is only one ring oscillator in a PSRO macro, there is only one Vt family. In step 560, the average PSRO frequency of the four corner (this refers to the PSRO macros of FIG. 1) PSRO ring oscillators of the selected Vt family are measured and the results averaged. There may be as few as one PSRO macro on a chip. There may be more or less than four PSRO macros on a chip, so "four" should be considered exemplary. In step 565, it is determined if the average is within a predefined specification limit for the selected Vt family. If the average is not within the predefined specification limit, the method proceeds to step 570, where the chip is marked as fail and thence to step 575. When performing the PSRO screen at wafer level, it means that chips marked as fail will not be "picked" after singulation (i.e., wafer dicing) and not mounted on modules. If in step 565, the average is within the predefined specification limit for the selected Vt family the method proceeds to step 580 where it is determined if there is another Vt family set of ring oscillators in the PSRO macros to measure. If there is another VT family to measure the method loops back to step 550 otherwise the method proceeds to step 585.

In step 585, the first/next Vt family pair is selected. For example, in the example of FIG. 11B, the pairs are 505A/505B, 505A/505C, 505A/505D, 505B/505C, 505N/505D and 505C/505D. The number of pairs is equal to total number of combinations of the number of Vt family ring oscillators in the macro taken two at a time. If there is only one PSRO macro, the method proceeds to step 590. In step 590, the average of the ratio of the four corner PSRO ring oscillators of the selected Vt family pair is determined. If, in step 595, the average is outside of predetermined bounds, the method proceeds to step 570, otherwise the method proceeds to step 600. Note that if there is only one ring oscillator per PSRO macro the method proceeds to step 605 instead of step 600. In step 600, it is determined if there is another Vt family pair. If there is another Vt family pair then the method loops back to step 585, otherwise the method proceeds to step 605. In step 605, the chip is marked are pass and the method proceeds to step 575. In step 575, it is determined if there is another chip to disposition. If there is another chip to disposition then the method loops back to step 550, otherwise the method terminates.

It should be understood that the steps of method of FIG. 15 may be revised in a manner so as to not effect the operation of the present invention. For example, instead of performing step 560 for each threshold voltage family in sequence, all the ring oscillators in all four corners could be measured and then the averaging and dispositioning performed. For example, instead of performing step 590 in sequence for each threshold voltage family pair, all the pair ratios could be determined and then the averaging and dispositioning performed.

Figure 16:
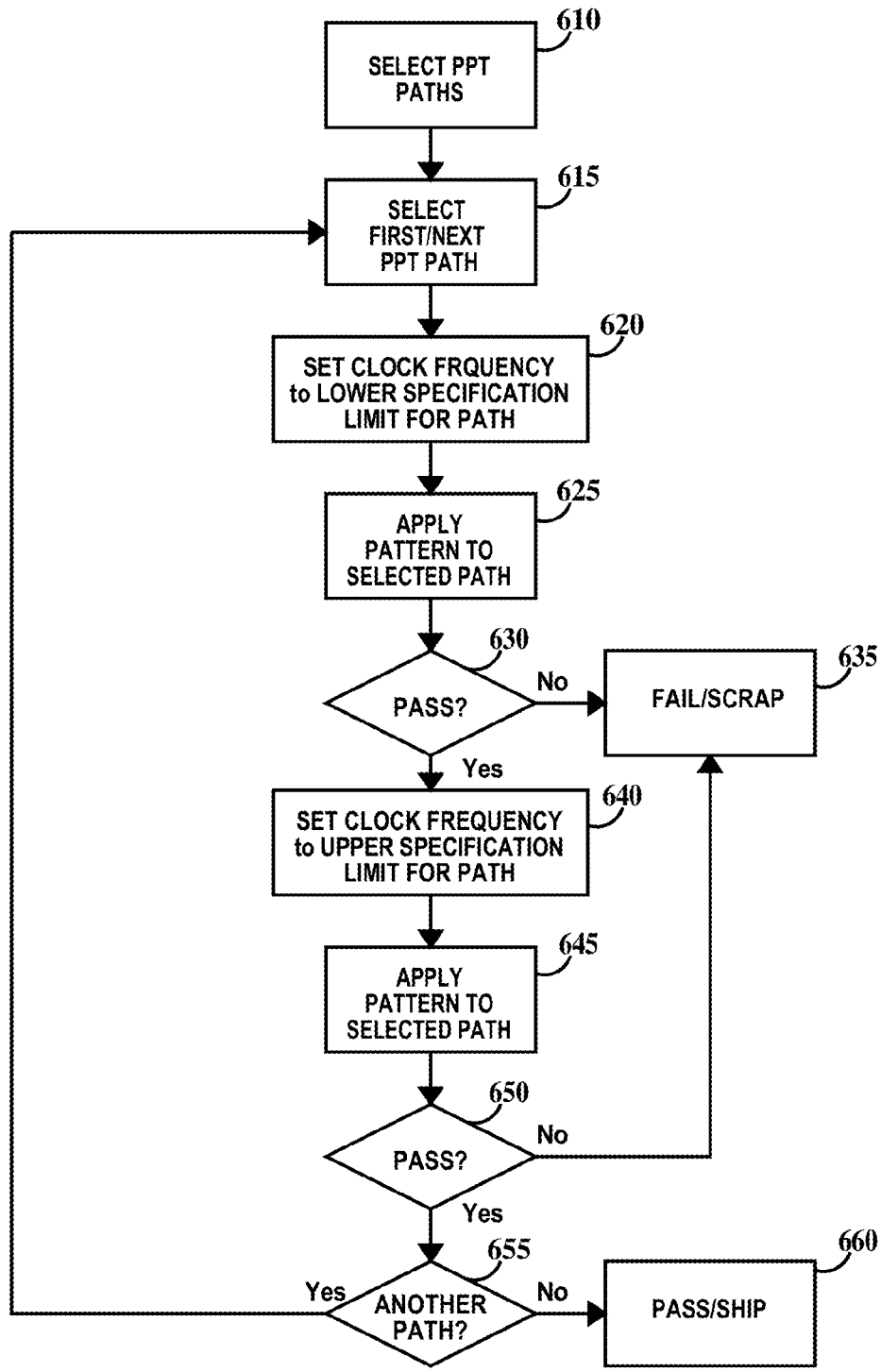
FIG. 16 is a flowchart of a method of performance path testing according to embodiments of the present invention.

FIG. 16 is a flowchart of a method of performance path testing according to embodiments of the present invention. In the example of FIG. 16, clock domains of the integrated circuit (see FIG. 1) may have the same or different nominal clock frequencies having the same or different bounds (lower and upper clock frequency specifications). In step 610, the performance path testing paths to be tested are selected. The number of paths to be selected may be all or a subset of the paths described supra relative to FIGS. 9 and 10. The paths selected may include between one and all clock domains of the integrated circuit chip. In step 615, the first/next performance path testing path is selected. In step 620, the clock frequency is set to the lower clock frequency specification (bound) of the current path. In step 625, test patterns are applied to the performance path testing data paths. In step 630, it is determined if the integrated circuit chip or module passed the performance path testing test (i.e., the output patterns were the expected patterns based on the input patterns). If the integrated circuit chip or module passed the performance path testing test then the method proceeds to step 625, otherwise the method proceeds to step 635. In step 635, the integrated circuit chip or module is marked as failing and may be scrapped or otherwise dispositioned.

In step 640, the clock frequency is set to the higher clock frequency specification (bound) of the current path. Note that the actual clock frequency applied to the path in this step may be less than the frequency that is set because the PLL circuit may not be able to generate the upper specification frequency. In step 645, test patterns are applied to the performance path testing data paths. In step 650, it is determined if the integrated circuit chip or module passed the performance path testing test (i.e., the output patterns were the expected patterns based on the input patterns). If the integrated circuit chip or module passed the performance path testing test then the method proceeds to step 655, otherwise the method proceeds to step 635.

In step 655 it is determined if there is another path to be tested. If there is another path then the method loops back to step 615, otherwise the method proceeds to step 660. In step 660, the integrated circuit or mode is marked as passing and may be shipped or put into inventory.

While FIG. 16 illustrates testing the critical path to both lower and upper performance specifications, it is possible to test the critical path against only the lower specification limit or against only the upper performance specification limit. For example, to test only against the lower performance limit, steps 640, 645 and 650 are not performed (or eliminated) so step 630 proceeds directly to step 655. For example, to test only against the upper performance limit, steps 620, 625 and 630 are not performed (or eliminated) so step 615 proceeds directly to step 640.

Generally, the method described herein with respect to methods for selecting critical paths for performance testing integrated circuit chips is practiced with a general-purpose computer and the methods described supra in the flow diagrams of FIGS. 6, 7, 8, 9 and 10 may be coded as a set of instructions on removable or hard media for use by the general-purpose computer.

Generally, the method described herein with respect to a method for disposition of integrated circuits is practiced with test systems that include a computer linked to or included in the test system and the methods described supra in the flow diagrams FIGS. 14, 15 and 16 may be coded as a set of instructions on removable or hard media for use by the computer.

Figure 17:
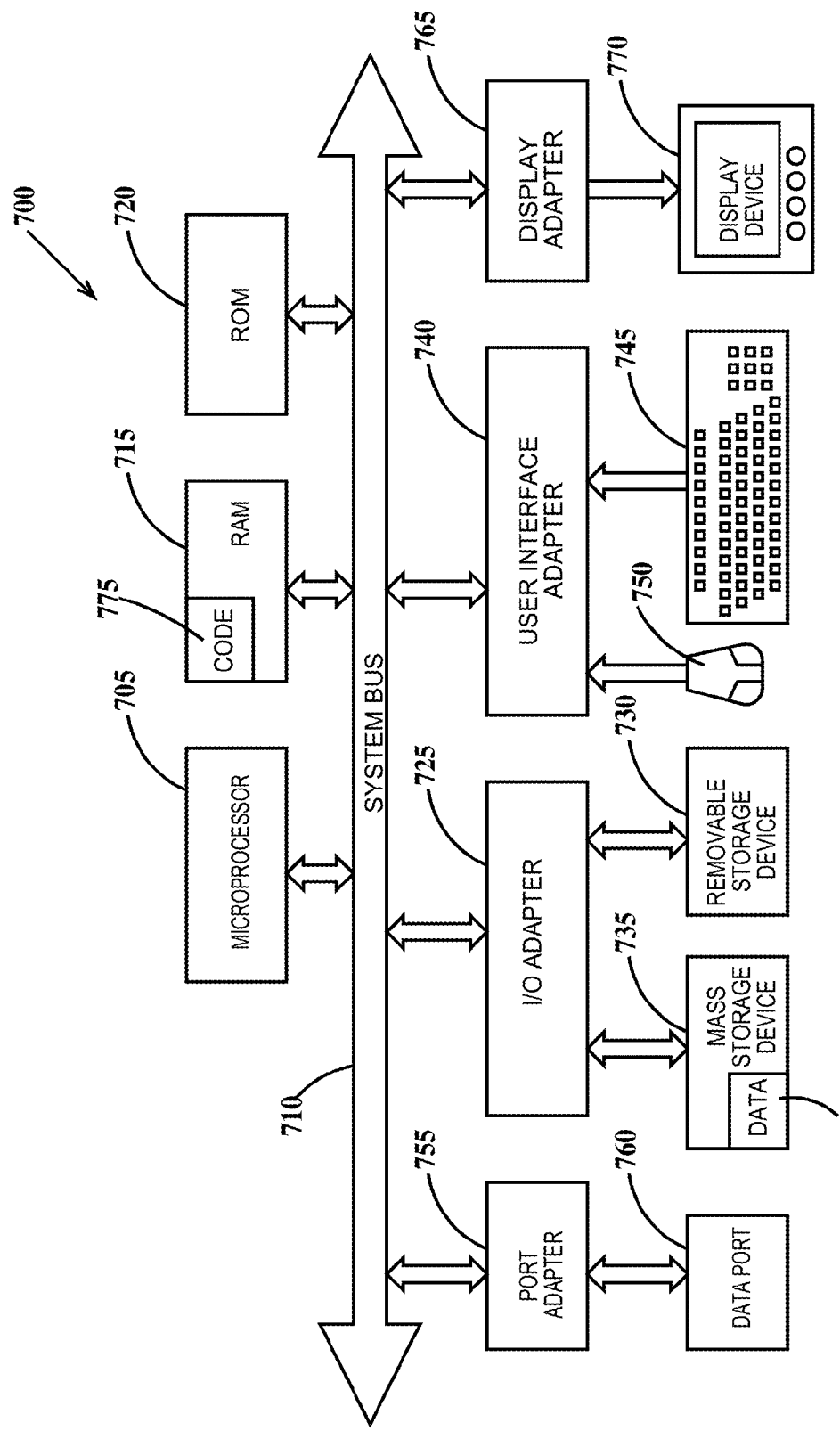
FIG. 17 is a schematic block diagram of a general-purpose computer that may be used in practicing embodiments of the present invention.

FIG. 17 is a schematic block diagram of a general-purpose computer that may be used in practicing embodiments of the present invention. In FIG. 17, computer system 700 has at least one microprocessor or central processing unit (CPU) 705. CPU 705 is interconnected via a system bus 710 to a random access memory (RAM) 715, a read-only memory (ROM) 720, an input/output (I/O) adapter 725 for connecting a removable data and/or program storage device 730 and a mass data and/or program storage device 735, a user interface adapter 740 for connecting a keyboard 745 and a mouse 750, a port adapter 755 for connecting a data port 760 and a display adapter 765 for connecting a display device 770.

ROM 720 contains the basic operating system for computer system 700. The operating system may alternatively reside in RAM 715 or elsewhere as is known in the art. Examples of removable data and/or program storage device 730 include magnetic media such as floppy drives and tape drives and optical media such as CD ROM drives. Examples of mass data and/or program storage device 735 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 745 and mouse 750, other user input devices such as trackballs, writing tablets, pressure pads, microphones, light pens and position-sensing screen displays may be connected to user interface 740. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 730, fed through data port 760 or typed in using keyboard 745.

Thus, the embodiments of the present invention provide methods of testing and dispositioning integrated circuit chips using a combination of performance sort ring oscillator testing at wafer level and performance path testing at module level that require less time and resource than conventional performance testing methods and at the same time reduce, if not eliminate, false accepts and false rejects.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    using a test apparatus, performing a performance path test on an integrated circuit chip having one or more clock domains, said performance path test applied to selected sensitizable data paths of said integrated circuit chip at different clock frequencies, said selected sensitizable data paths being data paths that are (i) less than all of the sensitizable data paths of said integrated circuit, (ii) are clocked by a single clock signal and (iii), and are critical data paths for which a time delay from an input of the data path to an output of the data path must be within a specified time delay limit at a specified clock frequency;
    applying test patterns to said selected sensitizable data paths; and
    dispositioning said integrated circuit chip based on comparing delays of said selected sensitized data paths to corresponding specified time delay limits for each of said selected sensitized data path at each frequency of said different frequencies.

2. The method of claim 1, wherein performing said performance path test includes:
    applying corresponding upper and lower clock frequencies and said test patterns to each path of said selected sensitizable data paths and failing said integrated circuit chip if resultant patterns do not match expected patterns based on said test patterns for any path of said selected sensitizable data paths.

3. The method of claim 1, wherein performing said performance path test includes:
    (a) selecting a path of said selected sensitizable data paths;
    (b) setting a clock frequency of said path to a lower frequency of two frequency specification limits, applying said clock frequency to said selected path and applying said test patterns to said selected path;
    (c) if any output patterns of said selected path does not match expected patterns based on said test patterns in (b) then failing said integrated circuit chip and terminating testing; and
    (d) if all output patterns of said selected path match expected patterns then repeating (a) through (c) for all selected paths and if no selected paths are failed in (c) then passing said integrated circuit chip and terminating testing.

4. The method of claim 1, wherein performing said performance path test includes:
    (a) selecting a path of said selected sensitizable data paths;
    (b) setting a clock frequency of said path to a lower frequency specification limit, applying said clock frequency to said selected path and applying said test patterns to said selected path;
    (c) if any output patterns of said selected path does not match expected patterns based on said test patterns in (b) then failing said integrated circuit chip and terminating testing;
    (d) if all output patterns of said selected path match expected patterns based on said test patterns then setting said clock frequency of said path to an upper frequency specification limit, applying said clock frequency to said selected path and applying said test patterns to said selected path;
    (e) if any output patterns of said selected path does not match expected patterns based on said test patterns in (d) then failing said integrated circuit chip and terminating testing; and
    (f) repeating (a) through (e) for all selected paths and if no selected paths are failed in (c) or in (e) then passing said integrated circuit chip and terminating testing.

5. The method of claim 1, including:
    performing said performance path test on said integrated when said integrated circuit chip is mounted on a module.

6. The method of claim 1, wherein said integrated circuit chip is un-singulated on a wafer during said performance path test.

7. The method of claim 1, wherein said integrated circuit chip includes at least one clock domain and said selected sensitizable data paths include data paths from all clock domains of said integrated circuit chip.

8. The method of claim 1, wherein said selected sensitizable data paths include data paths selected from different regions of said integrated circuit chip that include at least a portion of one clock domain.

9. The method of claim 1, including:
    generating said performance path test.

10. The method of claim 9, wherein generating said performance path test includes:
    identifying clock domains having multiple data paths of said integrated circuit chip design, said integrated circuit chip design having multiple clock domains;
    selecting, from said data paths, critical paths for each clock domain of the multiple clock domains;
    using a computer, for each clock domain of said multiple clock domains, selecting the sensitizable paths of said critical paths;
    for each clock domain of said multiple clock domains, selecting test paths from the sensitizable critical paths; and
    using a computer, creating a test program to performance test said test paths.

11. The method of claim 1, further including:
before performing said performance path test, performing a performance sort ring oscillator test on said integrated circuit chip and only performing said performance path test of said integrated circuit chip passes said performance sort ring oscillator test.

12. The method of claim 11, wherein said integrated circuit chip includes at least one set of at least one ring oscillator, different sets of ring oscillators having devices of different threshold voltage families and wherein said performance sort ring oscillator test includes:
(a) for each ring oscillator measuring an output frequency;
(b) for each threshold voltage family, determining an average output frequency of all ring oscillators of the same threshold voltage;
(c) if the average output frequency of any threshold voltage family is not within a first predetermined limit, failing the integrated circuit chip;
after (b) and (c), (d) taking said average output frequency of all ring oscillators of the same threshold voltage in all possible pairs threshold voltage family, determining the ratio of each pair;
(e) if the any ratio is not within a second predetermined limit, failing the integrated circuit chip; and
(f) if said integrated circuit chip is not failed in either (c) or (e) then passing the integrated circuit chip.

13. The method of claim 11, wherein said integrated circuit chip is un-singulated on a wafer during said performance sort ring oscillator test.

14. The method of claim 13, wherein said integrated circuit chip is mounted on a module during said performance path test.

15. A test system including a tester connected to a computer system comprising a processor, a memory coupled to the processor, and a computer readable storage device coupled to the processor, said storage device containing program code configured to be executed by the processor via the memory to implement a method for dispositioning integrated circuit chips, said method comprising:
performing a performance path test on an integrated circuit chip having one or more clock domains, said performance path test applied to selected sensitizable data paths of said integrated circuit chip at different clock frequencies, said selected sensitizable data paths being data paths that are (i) less than all of the sensitizable data paths of said integrated circuit, (ii) are clocked by a single clock signal and (iii), and are critical data paths for which a time delay from an input of the data path to an output of the data path must be within a specified time delay limit at a specified clock frequency;
applying test patterns to said selected sensitizable data paths; and
dispositioning said integrated circuit chip based on comparing delays of said selected sensitized data paths to corresponding specified time delay limits for each of said selected sensitized data path at each frequency of said different frequencies.

16. The test system of claim 15, wherein performing said performance path test includes the method steps:
applying corresponding upper and lower clock frequencies and said test patterns to each path of said selected sensitizable data paths and failing said integrated circuit chip if resultant patterns do not match expected patterns based on said test patterns for any path of said selected sensitizable data paths.

17. The test system of claim 15, wherein performing said performance path test includes the method steps of:

(a) selecting a path of said selected sensitizable data paths;
(b) setting a clock frequency of said path to a lower frequency of two frequency specification limits, applying said clock frequency to said selected path and applying said test patterns to said selected path;
(c) if any output patterns of said selected path does not match expected patterns based on said test patterns in (b) then failing said integrated circuit chip and terminating testing; and
(d) if all output patterns of said selected path match expected patterns then repeating (a) through (c) for all selected paths and if no selected paths are failed in (c) then passing said integrated circuit chip and terminating testing.

18. The test system of claim 15, wherein performing said performance path test includes the method steps of:
(a) selecting a path of said selected sensitizable data paths;
(b) setting a clock frequency of said path to a lower frequency specification limit, applying said clock frequency to said selected path and applying said test patterns to said selected path;
(c) if any output patterns of said selected path does not match expected patterns based on said test patterns in (b) then failing said integrated circuit chip and terminating testing;
(d) if all output patterns of said selected path match expected patterns based on said test patterns then setting said clock frequency of said path to an upper frequency specification limit, applying said clock frequency to said selected path and applying said test patterns to said selected path;
(e) if any output patterns of said selected path does not match expected patterns based on said test patterns in (d) then failing said integrated circuit chip and terminating testing; and
(f) repeating (a) through (e) for all selected paths and if no selected paths are failed in (c) or in (e) then passing said integrated circuit chip and terminating testing.

19. The test system of claim 15, including the method step of:
performing said performance path test on said integrated when said integrated circuit chip is mounted on a module.

20. The test system of claim 15, wherein said test system is configured to perform said performance path test while said integrated circuit chip is un-singulated on a wafer.

21. The test system of claim 15, wherein said integrated circuit chip includes at least one clock domain and said selected sensitizable data paths include data paths from all clock domains of said integrated circuit chip.

22. The test system of claim 15, wherein said selected sensitizable data paths include data paths selected from different regions of said integrated circuit chip that include at least a portion of one clock domain.

23. The test system of claim 15, the method including the step of:
before performing said performance path test, performing a performance sort ring oscillator test on said integrated circuit chip and only performing said performance path test of said integrated circuit chip passes said performance sort ring oscillator test.

24. The test system of claim 23, wherein said integrated circuit chip includes at least one set of at least one ring oscillator, different sets of ring oscillators having devices of different threshold voltage families and wherein said performance sort ring oscillator test includes:

(a) for each ring oscillator measuring an output frequency;
(b) for each threshold voltage family, determining an average output frequency of all ring oscillators of the same threshold voltages;
(c) if the average output frequency of any threshold voltage family is not within a first predetermined limit, failing the integrated circuit chip;
after (b) and (c), (d) taking said average output frequency of all ring oscillators of the same threshold voltage in all possible pairs threshold voltage family, determining the ratio of each pair;
(e) if the any ratio is not within a second predetermined limit, failing the integrated circuit chip; and
(f) if said integrated circuit chip is not failed in either (c) or (e) then passing the integrated circuit chip.

25. The test system of claim 23, wherein said test system is configured to perform said performance sort ring oscillator test while said integrated circuit chip is un-singulated on a wafer.

26. The test system of claim 23, wherein said test system is configured to perform said performance path test while said integrated circuit chip is mounted on a module.

27. A computer program product for dispositioning integrated circuit chips, the computer program product comprising:
a computer readable storage device having computer readable program code embodied therewith, the computer readable program code comprising:
computer readable program code configured to perform a performance path test of selected sensitizable data paths of an integrated circuit chip at different clock frequencies, said selected sensitizable data paths being data paths that are (i) less than all of the sensitizable data paths of said integrated circuit, (ii) are clocked by a single clock signal and (iii), and are critical data paths for which a time delay from an input of the data path to an output of the data path must be within a specified time delay limit at a specified clock frequency;
configured to apply test patterns to said selected sensitizable data paths; and
configured to disposition said integrated circuit chip based on comparing delays of said selected sensitized data paths to corresponding specified time delay limits for each of said selected sensitized data path at each frequency of said different frequencies.

28. The method of claim 1, further including:
before performing said performance path test, performing a performance sort ring oscillator test on said integrated circuit chip at wider specification limits than said performance path test and only performing said performance path test of said integrated circuit chip passes said performance sort ring oscillator test.

29. The test system of claim 15, the method including the step of:
before performing said performance path test, performing a performance sort ring oscillator test on said integrated circuit chip at wider specification limits than said performance path test and only performing said performance path test of said integrated circuit chip passes said performance sort ring oscillator test.

* * * * *